(12) United States Patent
Kajiura

(10) Patent No.: US 7,180,739 B2
(45) Date of Patent: Feb. 20, 2007

(54) ELECTRONIC EQUIPMENT

(75) Inventor: Katsuyuki Kajiura, Aichi (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 256 days.

(21) Appl. No.: 10/982,450

(22) Filed: Nov. 5, 2004

(65) Prior Publication Data

US 2005/0146851 A1  Jul. 7, 2005

(30) Foreign Application Priority Data

Nov. 7, 2003 (JP) ............................. 2003-377646

(51) Int. Cl.
*H05K 7/20* (2006.01)
(52) U.S. Cl. .................... 361/695; 361/688; 361/690; 361/694; 174/16.3; 165/80.3
(58) Field of Classification Search ................. None
See application file for complete search history.

(56) References Cited

U.S. PATENT DOCUMENTS

| | | | | |
|---|---|---|---|---|
| 5,630,469 A | * | 5/1997 | Butterbaugh et al. ...... 165/80.3 |
| 5,828,549 A | * | 10/1998 | Gandre et al. .............. 361/695 |
| 5,909,358 A | * | 6/1999 | Bradt ......................... 361/707 |
| 6,113,485 A | * | 9/2000 | Marquis et al. ............. 454/184 |
| 6,288,895 B1 | * | 9/2001 | Bhatia ........................ 361/687 |
| 6,297,957 B1 | * | 10/2001 | Johnson et al. ............. 361/687 |
| 6,469,894 B2 | * | 10/2002 | Ubukata ..................... 361/700 |
| 6,504,718 B2 | * | 1/2003 | Wu ............................. 361/695 |
| 6,772,246 B2 | * | 8/2004 | Kim et al. .................... 710/62 |
| 6,921,328 B1 | * | 7/2005 | Nohara et al. .............. 454/184 |

FOREIGN PATENT DOCUMENTS

JP  2002-353677  12/2002

* cited by examiner

*Primary Examiner*—Boris Chervinsky
(74) *Attorney, Agent, or Firm*—Morgan & Finnegan, L.L.P.

(57) ABSTRACT

An electronic equipment includes: a circuit board on which an electronic part is mounted to a mounting surface thereof; a heat radiating member mounted on the mounting surface of the circuit board and disposed in abutment with the electronic part to radiate heat generated by the electronic part; a fan mounted on the mounting surface of the circuit board; a housing in which the circuit board, the heat radiating member and the fan are installed; a first fixing member that fixes the heat radiating member onto the circuit board; and a second fixing member that fixes the heat radiating member to the housing.

17 Claims, 4 Drawing Sheets

(a)  (b)

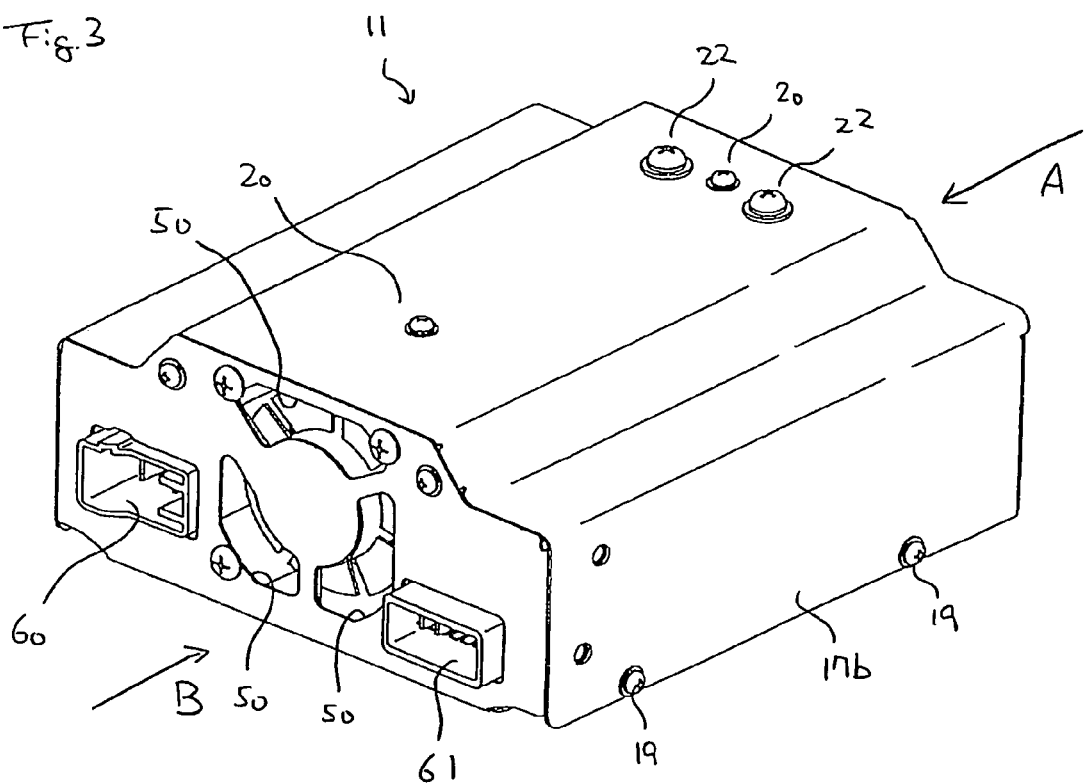
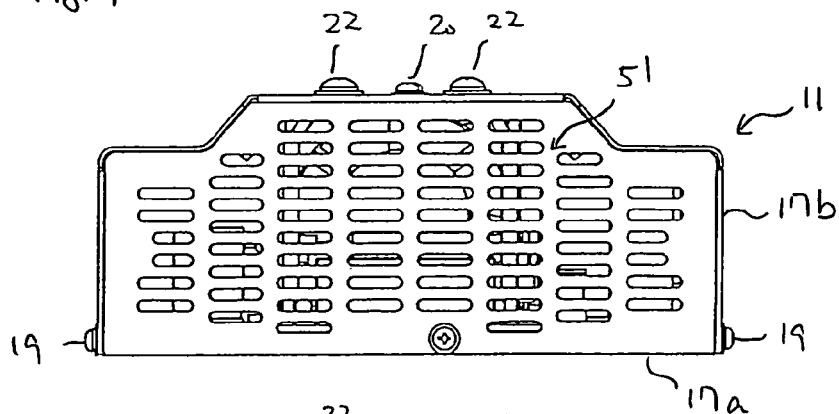
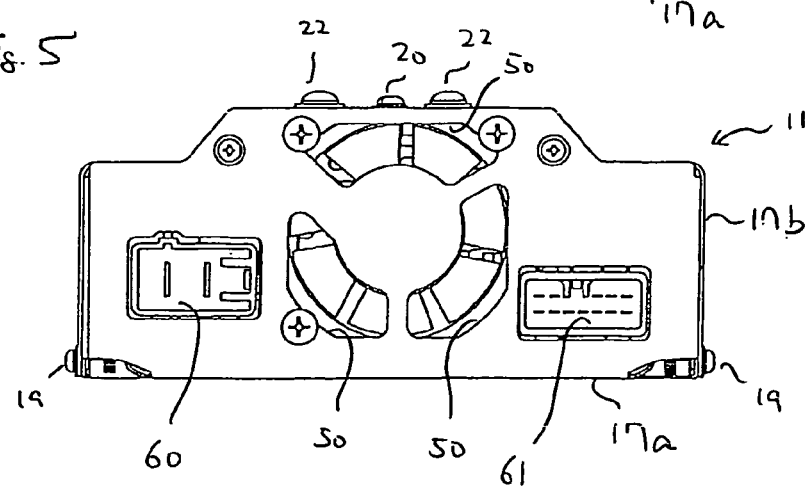

ELECTRONIC EQUIPMENT

BACKGROUND OF THE INVENTION

1. Field of the Invention

The present invention relates to an electronic equipment, and more particularly to an electronic equipment incorporating a printed circuit board with electronic parts mounted thereon.

2. Description of the Related Art

In conventional electronic equipments, heat sinks are fixed to individual electronic parts in order to radiate heat generated by the electronic parts through the heat sinks. The radiated heat is forcibly cooled by a fan. In the case of an electronic equipment such as a power converter mounted in an automobile, a printed circuit board with various electronic parts mounted thereon is used by being installed in a housing, so as to be protected from foreign objects such as dust and radiation noise from other electronic equipment. Generally, a box-shaped case divided into two parts of upper and lower parts is used as the housing.

FIG. 8 shows the interior of a conventional electronic equipment before the electronic equipment is built into a housing. Electronic parts 31 have heat sinks 32 attached thereto, and are mounted on a printed circuit board 33. A fan 34 is disposed in the center of an end portion of the printed circuit board 33. The printed circuit board 33 is built into the housing, which is not shown in FIG. 8. Accordingly, air heated by the heat sinks 32 is exhausted to outside the housing by the fan 34. However, there has been a problem in that, in conjunction with a tendency toward a higher output of electric power, the amounts of heat generated by the electronic parts 31 increase, resulting in insufficiency of radiating areas of the heat sinks 32.

In JP-A-2002-353677, there is proposed a heat radiating structure in which electronic parts are effectively cooled by controlling the flow of air due to the heat of the interior of the equipment (c.f. paragraphs [0009]–[0012], FIGS. 1 and 2). In the radiating structure disclosed in JP-A-2002-353677, electronic parts, a tubular heat radiating member, and a fan are mounted on a printed circuit board, and are built in the interior of a box-shaped housing. An electronic part is secured to a heat radiating member, and is mounted on the printed circuit board. The fan sends air in a direction toward the interior of the heat radiating member to cool the heat radiating member. Accordingly, the electronic part does not assume a high temperature, and its characteristics do not deteriorate.

SUMMARY OF THE INVENTION

However, in the conventional electronic equipment and in the radiating structure disclosed in JP-A-2002-353677, a structural body for supporting the entire device is the housing alone. Since the housing is a box-shaped case, the housing by itself lacks strength as the structural body. For that reason, in the event that an external force is applied to the electronic equipment, there is a possibility of the housing becoming deformed. In addition, in a case where the electronic equipment is mounted in an automobile, if vibrations are imparted to the housing, a printed circuit board 33 is likely to resonate, so that there has been a possibility of cracks or the like occurring in connections between the printed circuit board 33 and electronic parts 31.

The present invention has been devised to overcome the above-described problems, and one of objects of the invention is to provide an electronic equipment having a structure which is capable of effectively cooling the electronic parts and supports the entire electronic equipment.

According to a first aspect of the invention, there is provided an electronic equipment including: a circuit board on which an electronic part is mounted to a mounting surface thereof; a heat radiating member mounted on the mounting surface of the circuit board and disposed in abutment with the electronic part to radiate heat generated by the electronic part; a fan mounted on the mounting surface of the circuit board; a housing in which the circuit board, the heat radiating member and the fan are installed; a first fixing member that fixes the heat radiating member onto the circuit board; and a second fixing member that fixes the heat radiating member to the housing.

BRIEF DESCRIPTION OF THE DRAWINGS

The objects and advantages of the present invention will become more apparent by describing preferred exemplary embodiments thereof in detail with reference to the accompanying drawings, wherein:

FIG. 3 is a perspective view of the exterior of the electronic equipment;

FIG. 4 is a side view of the electronic equipment shown from a direction of arrow A shown in FIG. 3;

FIG. 5 is a side view of the electronic equipment shown from a direction of arrow B shown in FIG. 3;

DETAILED DESCRIPTION OF THE PREFERRED EMBODIMENTS

Hereafter, with reference to FIGS. 1–5, a description will be made of an electronic equipment 11 as an embodiment in which the invention is applied.

Figure 1:
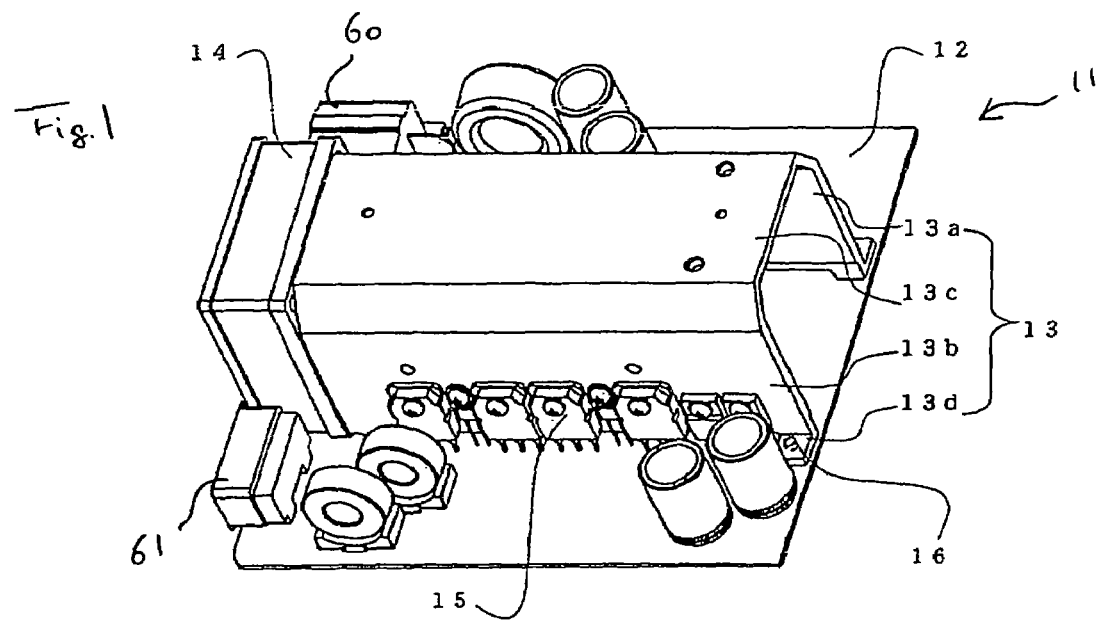
FIG. 1 is a perspective view of the interior of an electronic equipment according to an embodiment.

FIG. 1 shows the interior of the electronic equipment 11. A heat radiating member 13, a fan 14, and electronic parts 15 are installed on a mounting-surface side of a printed circuit board 12. The heat radiating member 13 has a pair of perpendicular pieces 13a and 13b disposed substantially perpendicular to the printed circuit board 12 and opposing with each other, as well as a horizontal piece 13c connecting the pair of perpendicular pieces 13a and 13b and disposed in parallel to the printed circuit board 12. The heat radiating member 13 is thus formed with the cross-sectional shape thereof in a substantially U-lettered shape. The heat radiating member 13 has a length substantially identical to a length in which the thickness of the fan 14 is subtracted from the length of the printed circuit board 12 in one direction (in FIG. 1, horizontal direction), and the heat radiating member 13 is disposed substantially in the center of the printed circuit board 12. In addition, a pair of attaching legs 13d are respectively provided on edges of the pair of perpendicular pieces 13a and 13b of the heat radiating member 13 on the opening side of the substantially U-lettered shape form. The heat radiating member 13 is fixed to the printed circuit board 12 by screws 16 that serves as a first fixing member. The fan 14 is disposed on a line extending perpendicular to the substantially U-shaped cross section of the heat radiating member 13 and in such a manner as to be adjacent to the heat radiating member 13. The fan 14 is disposed such that air is sent from the inner side (a portion surrounded by the perpendicular pieces 13a and 13b, the horizontal piece 13c, and the printed circuit board 12) of the heat radiating member 13 to outside the electronic equipment 11 through the fan 14. Further, among the electronic parts 15 mounted on the printed circuit board 12, those electronic parts 15 that generate large amounts of heat are disposed in abutment with the heat radiating member 13.

Figures 2A, 2B:
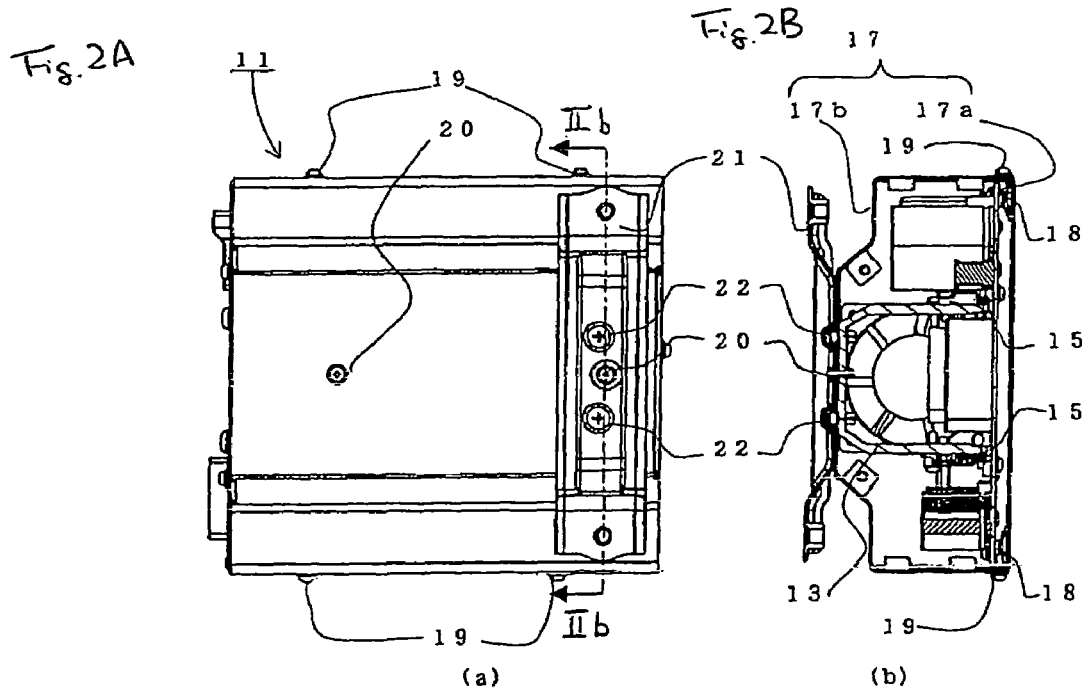
FIG. 2A is a top view of the electronic equipment.
FIG. 2B is a side cross-sectional view taken along the IIb—IIb line shown in FIG. 2A.

A housing 17 is dividable into a base plate 17a and a cover 17b, which are respectively formed by processing metallic thin plates into predetermined shapes. The cover 17b is formed into a shape corresponding to shapes and sizes of parts being mounted on the printed circuit board 12, and an outlet 50 is formed at a position corresponding to the fan 14 (see FIGS. 3 and 5). The cover 17b has an inlet 51 formed on a side facing to a side where the outlet 50 is formed (see FIGS. 3 and 4). On the side where the outlet 50 is formed, there is also provided a power terminal 60 and an output terminal 61. To the power terminal 60, a connector is connected and a power for the fan 14 and the electronic parts 15 are provided. Another connector is connected to the output terminal 61 and the output signals of the electronic pats 15 are output therethrough. The printed circuit board 12 is fixed to the base plate 17a by means of screws 18, and the cover 17b is fitted in such a manner as to cover the printed circuit board 12. The base plate 17a and the cover 17b are fixed together by screws 19, and constitute the housing 17. As a result, as shown in FIG. 2B, the printed circuit board 12 with various parts mounted thereon is set in a state of being assembled in the housing 17. The heat radiating member 13 and the cover 17b are arranged such that a surface of the horizontal piece 13c located away from the printed circuit board 12 and a surface of the cover 17b located on the printed circuit board 12 side are in contact with each other, and the heat radiating member 13 and the cover 17b are fixed to each other at their contacting surfaces by a screw 20 constituting a second fixing member. A bracket 21 for mounting in a vehicle is fixed by means of screws 22 to the heat radiating member 13 at the portion where the horizontal piece 13c and the cover 17b are overlapped on top of each other. In the embodiment, the screws 22 are passed through the cover 17b to fix the bracket 21 and the heat radiating member 13.

Next, a description will be given of the procedure of forming a power supply unit for an automobile by using the electronic equipment 11 configured in the above-described manner. First, the various electronic parts 15, including a transformer, a switching device, diodes, capacitors, and the like, and various terminals and the like are mounted on the printed circuit board 12. The fan 14 and the heat radiating member 13 are then mounted. The various terminals and the like refer to power supply terminals, output terminals, signal terminals, and the like. The printed circuit board 12 is then fixed to the base plate 17a by means of the screws 18, the cover 17b is fixed by the attaching screws 19, and the bracket 21 is attached with the screws 22, thereby completing the electronic equipment 11.

The electronic equipment 11 configured as described above is installed at a predetermined position in the vehicle by means of the bracket 21. Then, the electronic equipment 11 is set in a usable state as the power supply terminals are connected to a vehicle-mounted battery (not shown), the output terminals are connected to electronic equipment (not shown), and the signal terminals are connected to an ECU (not shown).

According to the embodiment, the following advantages are obtained.

(1) Since the heat radiating member 13 is formed into a shape having the cross sectional shape in substantially U-lettered shape having the pair of perpendicular pieces 13a and 13b and the horizontal piece 13c formed integrally therewith, it is easily possible to secure the radiating area of the heat radiating member 13, and to effectively cool the electronic parts 15 abutting with that heat radiating member 13.

(2) Since the opening side of the heat radiating member 13 of the substantially U-lettered shape is disposed facing the printed circuit board 12, the electronic parts 15 can be mounted on the printed circuit board 12 on the inner side of the heat radiating member 13. Accordingly, it is unnecessary to enlarge the printed circuit board 12 for the purpose of attaching the heat radiating member 13.

(3) The fan 14 is disposed on a line extending perpendicular to the cross section of the heat radiating member 13 having substantially U-lettered shape and in such a manner as to be adjacent to the heat radiating member 13. The air inside the heat radiating member 13 is heated by the radiation of heat from the inner surface of the heat radiating member 13 and the electronic parts mounted on the inner side of the heat radiating member 13. Then, the heated air is sent to outside the electronic equipment 11 by the fan 14. Accordingly, the inner side of the heat radiating member 13 and the electronic parts 15 mounted on the inner side of the heat radiating member 13 can be selectively cooled.

(4) The heat radiating member 13 is fixed at its four attaching legs 13d to the printed circuit board 12 by the screws 16. Accordingly, even if an external force is applied to the printed circuit board 12, since the printed circuit board 12 is supported by the heat radiating member 13, the printed circuit board 12 is unlikely to break and resonate. In addition, cracks or the like are unlikely to occur in connections between the printed circuit board 12 and the electronic parts 15.

(5) The heat radiating member 13 and the cover 17b of the housing 17 are fixed by the screw 20. Accordingly, the strength of the electronic equipment 11 as a structural body improves.

(6) As for the bracket 21 for mounting in a vehicle, the screws 22 are passed through the cover 17b to fix the bracket 21 and the heat radiating member 13. Since the external force applied to the housing 17 can be supported by means of the bracket 21, the strength improves as compared with the case where the heat radiating member 13 is not provided.

It should be noted that the embodiment is not limited to the above-described configuration, and may be arranged as described below.

A gap may be provided between each of the perpendicular pieces 13a and 13b of the heat radiating member 13 and the printed circuit board 12. In this case, it is possible to effectively cool the electronic parts 15 disposed on the outer side of the heat radiating member 13 and in the vicinities of the perpendicular pieces 13a and 13b.

Although the heat radiating member 13 is disposed substantially in the center of the printed circuit board 12, the place where it is disposed is not limited insofar as it is disposed on a mounting surface of the printed circuit board 12.

The fan 14 may be disposed in such a manner as to send air from the outer side of the electronic equipment 11 toward the inner side of the heat radiating member 13 through the fan 14.

Although the electronic parts 15 are disposed in abutment with the heat radiating member 13, a heat transfer material such as a radiating sheet may be disposed in such a manner as to be sandwiched between the respective electronic part 15 and the heat radiating member 13. In this case, the heat generated by the electronic part 15 can be effectively transferred to the heat radiating member 13.

Although the first fixing member 16 and the second fixing member 20 are screws, the first fixing member 16 and the second fixing member 20 may be fastening means such as rivets, for example.

The housing 17 is not limited to a formed part obtained by processing a metallic thin plate, and may be a molded product made of a plastic.

The position where the bracket 21 is attached is not limited to the surface where the horizontal piece 13c and the cover 17b are overlapped on top of each other. Since the housing 17 is supported by the heat radiating member 13, the bracket 21 may be directly attached to the housing 17.

Although the electronic equipment 11 is installed at a predetermined position in an automobile by means of the bracket 21, the electronic equipment 11 may be installed without using the bracket 21.

Figure 6:
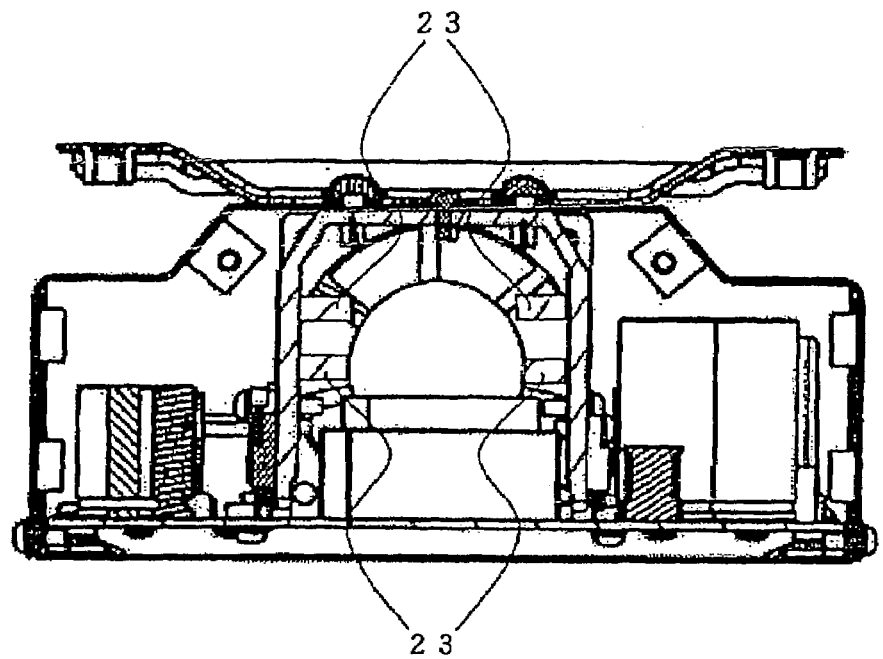
FIG. 6 is a cross-sectional view of the electronic equipment according to another embodiment.

The heat radiating member 13 may be provided with fins 23 provided on a surface thereof, as shown in FIG. 6. The heat radiating member 13 may also be provided with a groove instead of the fins 23. The electronic equipment is preferable to be configured that the heat radiating member 13 is formed with a convex and concave surface. Accordingly, the surface area of the heat radiating member 13 increases, and the radiating capability of the heat radiating member 13 improves.

As for the fins 23, it suffices if they are provided on the inner side of the heat radiating member 13 and on at least one or more surfaces of the perpendicular pieces 13a and 13b and the horizontal piece 13c. In this case, since the inner side of the heat radiating member 13 is selectively cooled by the fan 14, the radiation efficiency of the heat radiating member 13 improves further.

Figure 7:
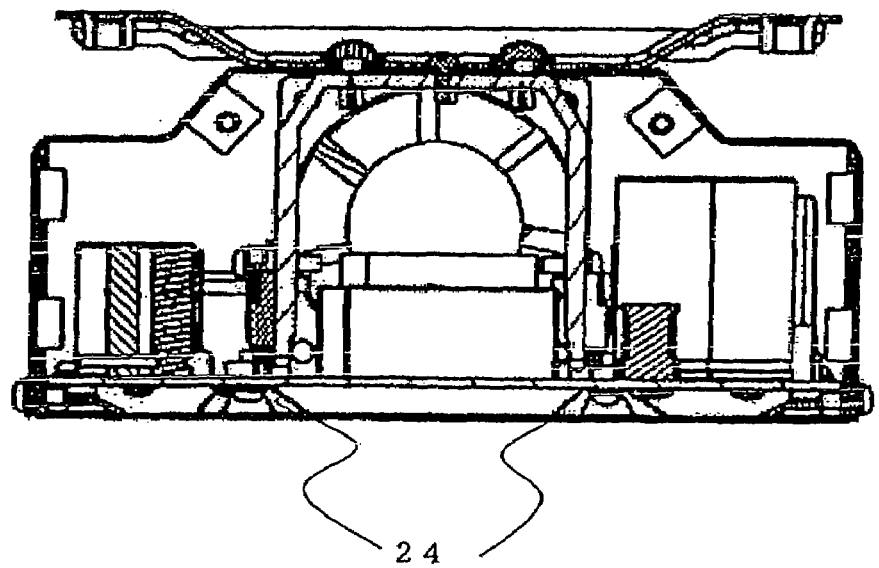
FIG. 7 is a cross-sectional view of the electronic equipment according to still another embodiment.
Figure 8:
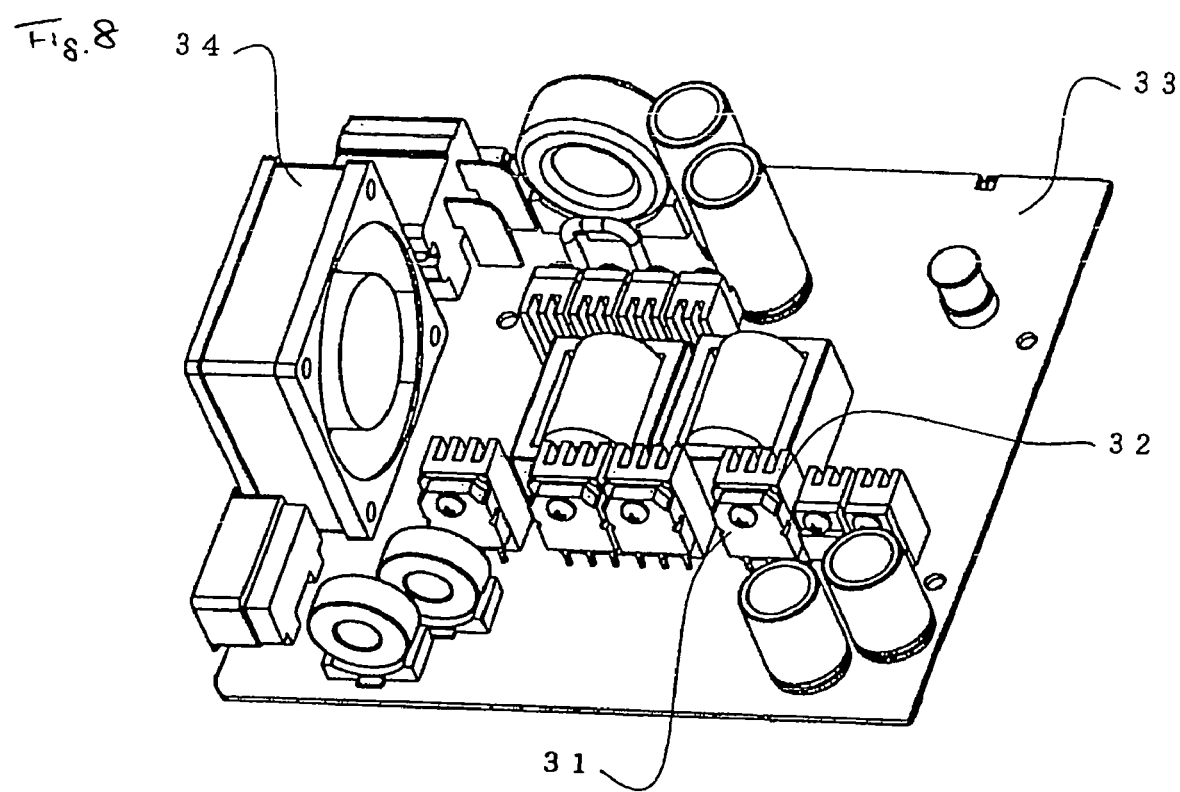
FIG. 8 is a perspective interior view of a conventional electronic equipment.

In a case where portions for fixing the printed circuit board 12 and the base plate 17a are located at end portions of the base plate 17a, supporting members 24 may be provided at a central portion of the base plate 17a between the printed circuit board 12 and the base plate 17a of the housing 17, as shown in FIG. 7. Hence, the resonance phenomenon occurring in the printed circuit board 12 can be alleviated further.

The aforementioned supporting members 24 may be formed of an elastic material, and may be such a material as rubber, nonwoven fabric, felt, plastic foam, or the like.

As described above, according to the embodiment, it becomes possible to easily secure a radiating area and effectively cool the electronic parts. In addition, since the heat radiating member structurally supports the printed circuit board and the housing, it is possible to support the entire electronic equipment.

According to the embodiment, the heat radiating member is formed into a substantially U-lettered shape cross section, and a substantially U-lettered shape opening side of the heat radiating member is fixed facing the printed circuit board. Accordingly, the electronic parts can be mounted on the printed circuit board on the substantially U-lettered shape opening side of the heat radiating member. Therefore, it is unnecessary to enlarge the printed circuit board for the purpose of attaching the heat radiating member.

According to the embodiment, the fan is disposed on a line extending perpendicular to the substantially U-lettered shape cross section of the heat radiating member, and the fan sends air into the housing. Accordingly, air heated by the heat radiating member can be selectively exhausted by the fan. The fan may be configured to send air outward from the housing.

According to the embodiment, the heat radiating member has a fin. Accordingly, the surface area of the heat radiating member increases, so that the radiation efficiency of the heat radiating member improves further.

By providing a supporting member between the printed circuit board and the housing, the resonance phenomenon occurring in the printed circuit board can further be alleviated.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. An electronic equipment comprising:
   a circuit board on which an electronic part is mounted to a mounting surface thereof;
   a heat radiating member mounted on the mounting surface of the circuit board and disposed in abutment with the electronic part to radiate heat generated by the electronic part;
   a fan mounted on the mounting surface of the circuit board;
   a housing in which the circuit board, the heat radiating member and the fan are installed;
   a first fixing member that fixes the heat radiating member onto the circuit board; and
   a second fixing member that fixes the heat radiating member to the housing.

2. The electronic equipment according to claim 1, wherein the circuit board includes a printed circuit board.

3. The electronic equipment according to claim 1, wherein the heat radiating member is formed into a shape having a substantially U-lettered shape cross section, and
   wherein the heat radiating member is fixed onto the circuit board with an opening side of the U-lettered shape being facing to the circuit board.

4. The electronic equipment according to claim 3, wherein the heat radiating member includes:
   a pair of perpendicular pieces disposed substantially perpendicular to the circuit board and opposes with each other; and
   a horizontal piece connecting the pair of perpendicular pieces and disposed in parallel to the circuit board.

5. The electronic equipment according to claim 4, wherein the heat radiating member further includes attaching legs respectively provided on edges of the pair of perpendicular pieces.

6. The electronic equipment according to claim 5, wherein the attaching legs are fixed onto the circuit board by the first fixing member.

7. The electronic equipment according to claim 4, wherein the horizontal piece is fixed to the housing by the second fixing member.

8. The electronic equipment according to claim 3, wherein the fan is disposed on a line extending perpendicular to the U-lettered shape cross section of the heat radiating member.

9. The electronic equipment according to claim 8, wherein the fan sends air into the housing.

10. The electronic equipment according to claim 8, wherein the fan sends air outward from the housing.

11. The electronic equipment according to claim 1, wherein the heat radiating member is formed with a convex and concave surface.

12. The electronic equipment according to claim 11, wherein the heat radiating member includes a fin provided on a surface thereof.

13. The electronic equipment according to claim 11, wherein the heat radiating member includes a groove formed on a surface thereof.

14. The electronic equipment according to claim 1, wherein a supporting member is provided between the circuit board and the housing.

15. The electronic equipment according to claim 1, wherein the heat radiating member has a length substantially identical to a length in which a thickness of the fan is subtracted from a length of the circuit board in one direction.

16. The electronic equipment according to claim 1, wherein the housing is formed of metal.

17. The electronic equipment according to claim 1, wherein the housing includes an inlet and an outlet formed thereon.

* * * * *

UNITED STATES PATENT AND TRADEMARK OFFICE
CERTIFICATE OF CORRECTION

PATENT NO. : 7,180,739 B2
APPLICATION NO. : 10/982450
DATED : February 20, 2007
INVENTOR(S) : Katsuyuki Kajiura It is certified that error appears in the above-identified patent and that said Letters Patent is hereby corrected as shown below:

IN THE SPECIFICATION

Column 1, line 66, please delete "one of objects" and insert therefore -- one of the objects --;

Column 2, line 67, please delete "screws 16 that serves" and insert therefore -- screws 16 that serve --;

Column 3, line 2, please delete "cross section" and insert therefore -- cross-section --;

Column 3, line 28, please delete "pats 15" and insert therefore -- parts 15 --;

Column 4, line 7, please delete "cross sectional" and insert therefore
-- cross-sectional --;

Column 4, line 22, please delete "cross section" and insert therefore -- cross-section --;

Column 4, line 23, please delete "having substantially" and insert therefore -- having a substantially --;

Column 5, line 62, please delete "cross section" and insert therefore -- cross-section --; and Column 6, line 5, please delete "cross section" and insert therefore -- cross-section --.

IN THE CLAIMS

In Claim 3 at column 6, line 46, please delete "cross section" and insert therefore
-- cross-section --; and

UNITED STATES PATENT AND TRADEMARK OFFICE
CERTIFICATE OF CORRECTION

PATENT NO. : 7,180,739 B2
APPLICATION NO. : 10/982450
DATED : February 20, 2007
INVENTOR(S) : Katsuyuki Kajiura It is certified that error appears in the above-identified patent and that said Letters Patent is hereby corrected as shown below:

In Claim 8 at column 7, line 3, please delete "cross section" and insert therefore -- cross-section --.

Signed and Sealed this

Twenty-second Day of September, 2009

David J. Kappos
*Director of the United States Patent and Trademark Office*